(12) United States Patent
Wang et al.

(10) Patent No.: US 11,099,234 B2
(45) Date of Patent: Aug. 24, 2021

(54) FALSE DETECTION METHOD FOR LOADING PROBE CARD

(71) Applicant: Taiwan Semiconductor Manufacturing Co., Ltd., Hsinchu (TW)

(72) Inventors: Chia-Wei Wang, Taipei (TW); Wei-Jr Yang, Nantou County (TW); Chien-Fang Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 133 days.

(21) Appl. No.: 16/554,960

(22) Filed: Aug. 29, 2019

(65) Prior Publication Data

US 2020/0088788 A1 Mar. 19, 2020

Related U.S. Application Data

(60) Provisional application No. 62/732,594, filed on Sep. 18, 2018.

(51) Int. Cl.
| | |
|---|---|
| *G01R 31/00* | (2006.01) |
| *G01R 31/28* | (2006.01) |
| *G01R 1/04* | (2006.01) |
| *G01R 1/067* | (2006.01) |
| *G01R 1/073* | (2006.01) |

(52) U.S. Cl.
CPC ..... *G01R 31/2891* (2013.01); *G01R 1/07342* (2013.01); *G01R 31/2887* (2013.01); *G01R 31/2889* (2013.01); *G01R 31/2893* (2013.01)

(58) Field of Classification Search
CPC ........ G01R 31/00; G01R 31/02; G01R 31/28; G01R 31/2851; G01R 31/2886; G01R 31/2887; G01R 31/2889; G01R 1/04; G01R 1/067; G01R 1/073; G01R 1/07342
See application file for complete search history.

(56) References Cited

U.S. PATENT DOCUMENTS

| | | | | |
|---|---|---|---|---|
| 2015/0276811 | A1* | 10/2015 | Yamada | G01R 31/2893 324/756.03 |
| 2018/0252765 | A1* | 9/2018 | Nagashima | G01R 31/2887 |

* cited by examiner

*Primary Examiner* — Neel D Shah
(74) *Attorney, Agent, or Firm* — McClure, Qualey & Rodack, LLP (57) ABSTRACT

A method for loading a probe card into a prober is provided. The method includes placing a probe card on a carrier plate and analyzing signals produced by two detection sensors. The detection sensor produces the correct signal when the probe card is placed in a normal state, and produces a false signal when the probe card is placed in an abnormal state. In addition, the method includes sending the probe card into the prober in response to the correct signals produced by both detection sensors. Alternatively, the method includes removing the probe card from the carrier plate and placing the probe card on the carrier plate again after adjustment of the probe card in response to a false signal produced by either of the detection sensors.

20 Claims, 11 Drawing Sheets

FALSE DETECTION METHOD FOR LOADING PROBE CARD

CROSS REFERENCE TO RELATED APPLICATIONS

The present application claims priority of U.S. Provisional Patent Application No. 62/732,594, filed on Sep. 18, 2018, the entirety of which is incorporated by reference herein.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the 7 nm node). As semiconductor devices are scaled down, new techniques are needed to maintain the electronic components' performance from one generation to the next. Device complexity is increasing as manufacturers design smaller feature sizes and more functionality into integrated circuits.

Semiconductor devices are tested by a test system to determine whether the semiconductor device operates as desired. The test system may send input signals to the semiconductor device via a probe card which is in contact with the semiconductor wafer and receives output signals from the semiconductor device to check the functionality of the semiconductor device.

Although numerous improvements to the methods of the test system have been invented, they have not been entirely satisfactory in all respects. Consequently, it is desirable to provide a solution that will improve the test system so as to mitigate or avoid damage to the probe card due to improper placement during its loading onto the test system.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1:
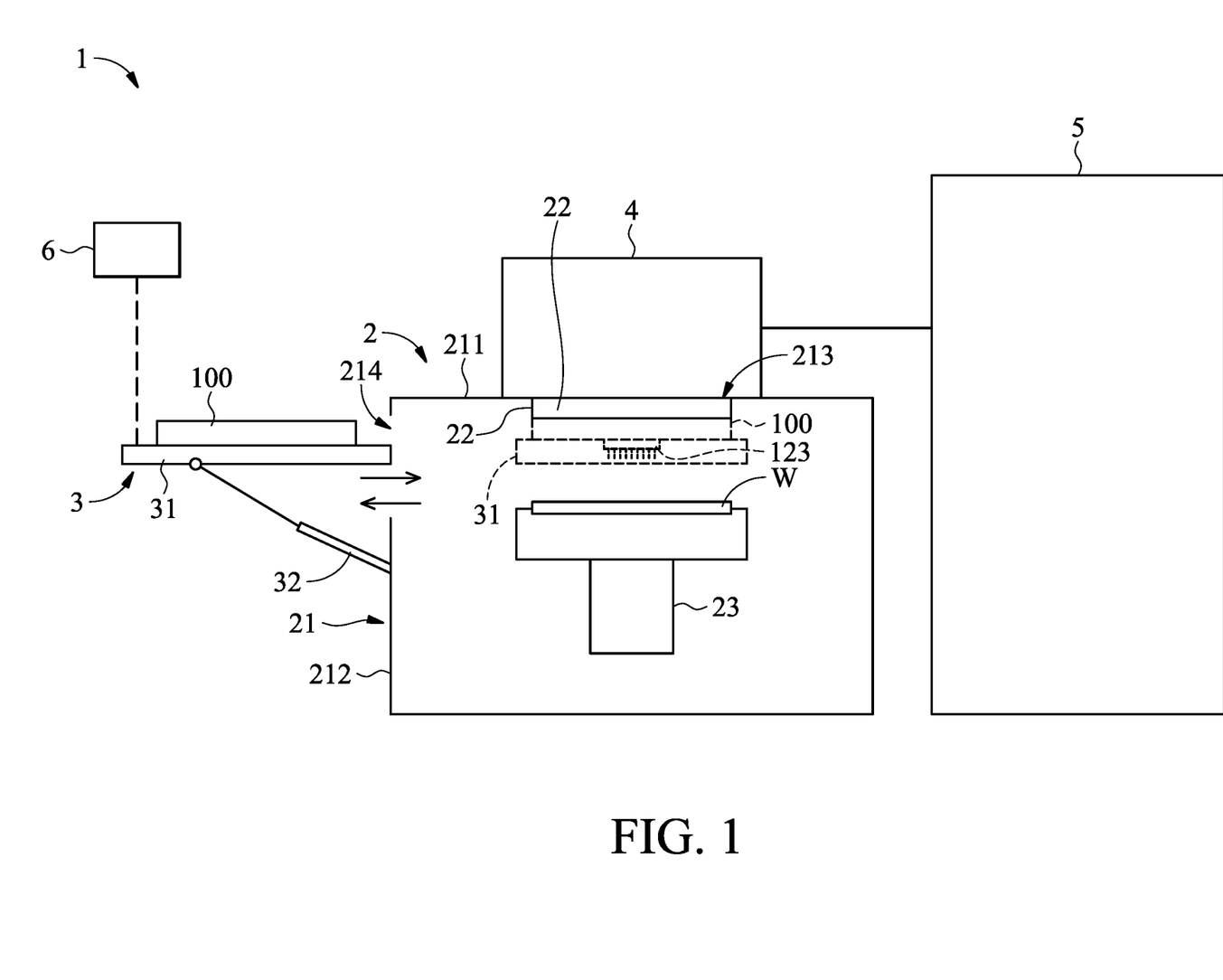
FIG. 1 shows a schematic view of a test system, in accordance with some embodiments.

FIG. 1 shows a schematic view of a test system 1, in accordance with some embodiments. The test system 1 implements integrated circuit manufacturing processes to fabricate integrated circuit devices. For example, the test system 1 may implement a wafer acceptance test (WAT) that tests individual dies within a semiconductor wafer after fabrication (e.g., prior to packaging the die). It should be noted that, in FIG. 1, the test system 1 has been simplified for the sake of clarity and to better understand the inventive concepts of the present disclosure. Additional features can be added in the test system 1, and some of the features described below can be replaced or eliminated in other embodiments of the test system 1.

The semiconductor wafer W may be made of silicon or another semiconductor material. Alternatively or additionally, the semiconductor wafer W may include other elementary semiconductor materials such as germanium (Ge). In some embodiments, the semiconductor wafer W is made of a compound semiconductor such as silicon carbide (SiC), gallium arsenic (GaAs), indium arsenide (InAs), or indium phosphide (InP). In some embodiments, the semiconductor wafer W is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer W includes an epitaxial layer. For example, the semiconductor wafer W has an epitaxial layer overlying a bulk semiconductor. In some embodiments, the semiconductor wafer W may be a silicon-on-insulator (SOI) or a germanium-on-insulator (GOI) substrate.

The semiconductor wafer W may have various device elements. Examples of device elements that are formed in the semiconductor wafer W include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), and diodes. Various processes are performed to form the device elements, such as deposition, etching, implantation, photolithography, annealing, and other suitable processes.

In some embodiments, as shown in FIG. 1, the test system 1 includes a prober 2, an interface device 3, a test head 4, a test apparatus 5, a controller 6, and a probe card 100.

The prober 2 is configured to perform the wafer acceptance test. In one exemplary embodiment, the prober 2 includes a test chamber 21, a card holder 22, and a wafer-mounted table 23. It should be appreciated that additional features can be added to the prober 2, and some of the features described below can be replaced or eliminated in other embodiments of the prober 2.

The test chamber 21 is configured to accommodate a semiconductor wafer W which is going to undergo a wafer acceptance test. The test chamber 21 has a hollow configuration and includes an upper sidewall 211 supported by a lateral sidewall 212. In some embodiments, a top opening 213 is formed on the upper sidewall 211.

The card holder 22 is positioned on the upper sidewall 211 and arranged relative to the top opening 213. In one exemplary embodiment, the card holder 22 has an opening (not shown) which has a shape that is compatible with that of the probe card 100 so as to carry the probe card 100. For example, both the opening and the probe card 100 are rectangular, and the width of the opening of the card holder 22 is compatible with the width of the probe card 100 to allow the probe card 100 to be mounted thereon.

The test head 4 is positioned relative the top opening 213 of the prober 2 and is supported by the prober 2. The test head 4 provides an interface between the probe card 100 and the test apparatus 5. In some embodiments, the test head 4 is constructed so as to be movable relative to the test chamber 21 via a hinge mechanism (not shown in figures). When the probe card 100 is secured by the card holder 22, the test head 4 is electrically connected to the probe card 100 to transmit test signals to the probe card 100.

The test head 4 may include electronic circuitry that may be configured in a variety of ways. For example, an electronic circuit may be configured to generate input signals (e.g., the stimulus signals) for the probe card 100. The electronic circuit may also be configured to compare received signals from the probe card 100 to validation signals furnished by the tester program of the test apparatus 5 to ensure that the integrated circuit on the semiconductor wafer W is functioning correctly.

The wafer-mounted table 23 is disposed in the test chamber 21. In some embodiments, the wafer-mounted table 23 is configured for holding, positioning, moving, and otherwise manipulating the semiconductor wafer W. The semiconductor wafer W may be secured on the wafer-mounted table 23 using a clamping mechanism, such as vacuum clamping or e-chuck clamping. The wafer-mounted table 23 is designed and configured to be operable for vertical, translational, and rotational motion.

In some embodiments, one or more channels 214 (only one channel 214 is shown in FIG. 1) are formed on the lateral wall sidewall 212. Each of the channels 214 is placed in communication with an interior of the test chamber 21 and the outer surroundings. The interface device 3 is positioned relative to the channel 214. The interface device 3 is configured to support and dock the probe card 100 for facilitating the insertion of the probe card 100 into, and its subsequent removal from, the test chamber 21 of the prober 2.

Structural features of the interface device 3 are described below, in accordance with some embodiments.

In some embodiments, the interface device 3 includes a carrier plate 31 and a driving member 32. It should be appreciated that additional features can be added to the interface device 3, and some of the features described below can be replaced or eliminated in other embodiments of the interface device 3.

The driving member 32 is configured to support the carrier plate 31 and control the movement of the carrier plate 31. In one exemplary embodiment, the driving member 32 moves the carrier plate 31 from a probe card ducking position (as indicated by a solid line in FIG. 1) to a probe card loading position (as indicated by a dotted line in FIG. 1) to convey the probe card 100 supported by the carrier plate 31 into the prober 2. In addition, the driving member 32 moves the carrier plate 31 from the probe card loading position (as indicated by a dotted line in FIG. 1) to the probe card ducking position (as indicated by a solid line in FIG. 1) to convey the probe card 100 supported by the carrier plate 31 out of the prober 2.

However, it should be appreciated that many variations and modifications can be made to embodiments of the disclosure. In some embodiments, the driving member 32 moves the carrier plate 31 from the probe card ducking position (as indicated by a solid line in FIG. 1) to a storage shelf (not shown in figures) located in the prober 2, and the probe card 100 is deposited on the storage shelf. The probe card 100 may be moved to the card holder 22 by another transporter (such as robotic arm, not shown in figures) from the storage shelf for use in a subsequent wafer acceptance test. The driving member 32 may be controlled in response to control signals issued by the controller 6.

Figure 2:
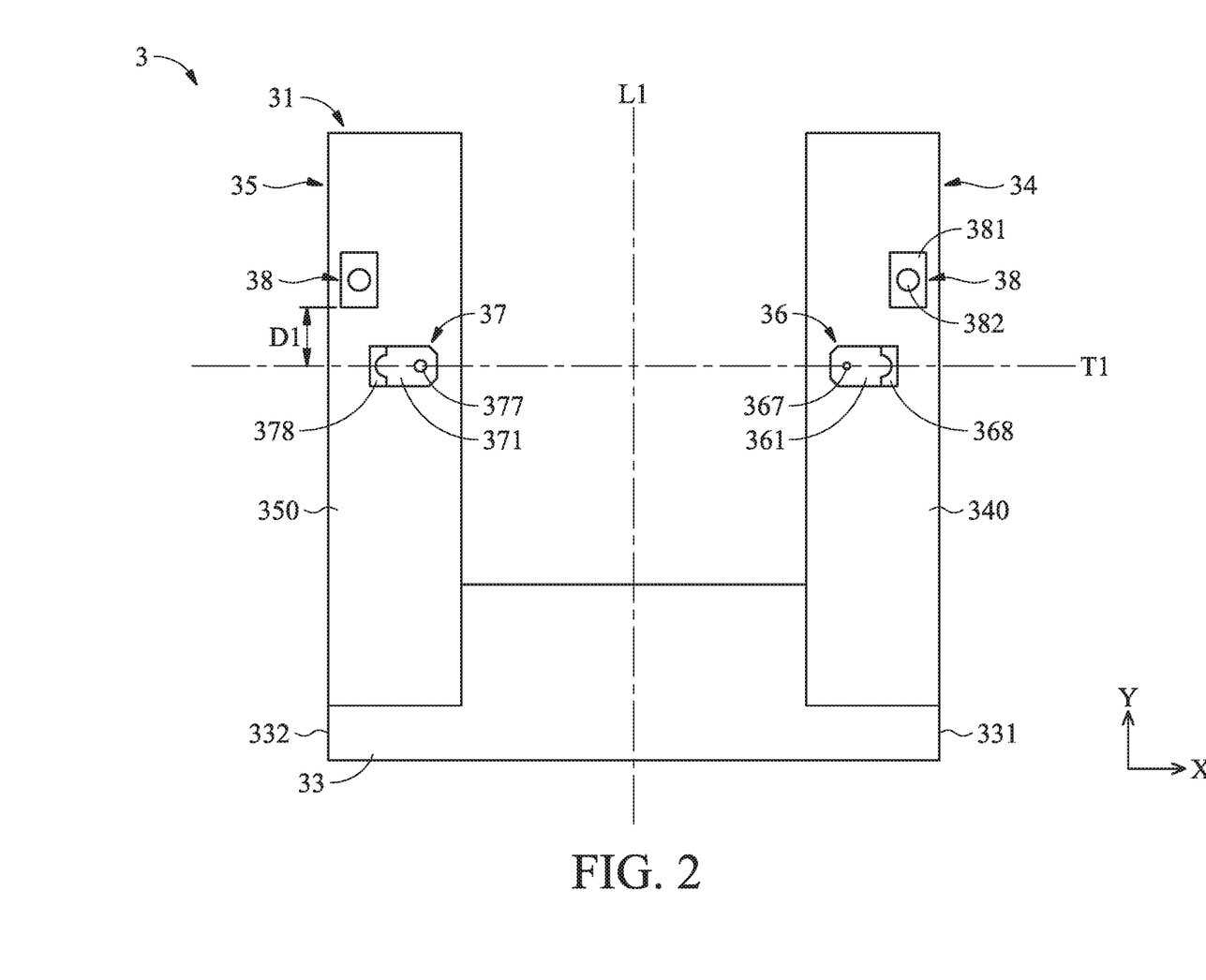
FIG. 2 shows a top view of an interface device, in accordance with some embodiments.
Figure 3:
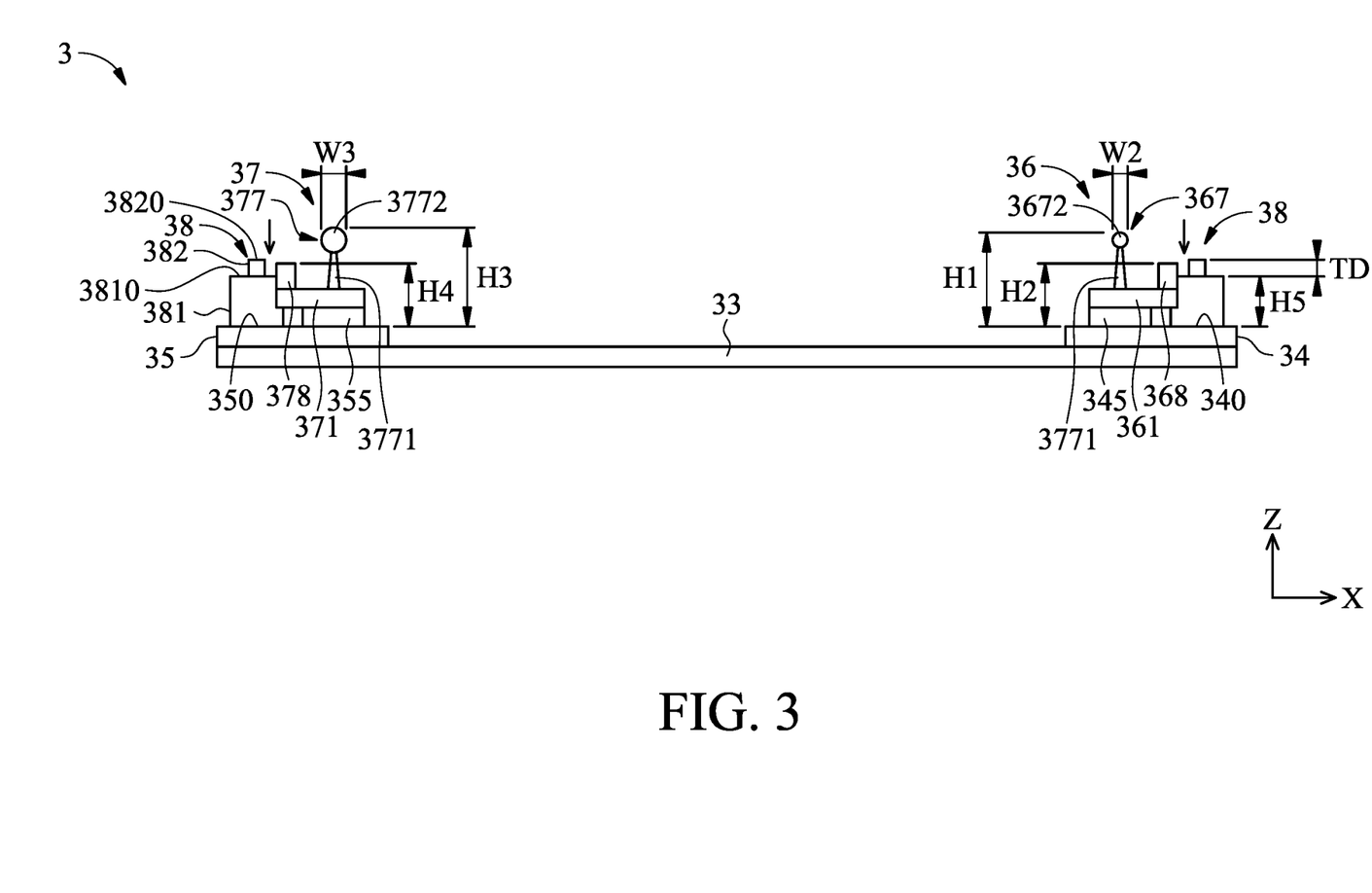
FIG. 3 shows a cross-sectional view of the interface device taken along line A-A of FIG. 2, in accordance with some embodiments.

FIG. 2 shows a top view of the carrier plate 31, and FIG. 3 shows a cross-sectional view of the carrier plate 31 taken along a transverse axis T1 of FIG. 2, in accordance with some embodiments. In some embodiments, the carrier plate 31 includes a number of blades, such as blades 33, 34 and 35. The blade 33 extends in a direction that is perpendicular to the longitudinal axis L1 from a first end 331 to a second end 332.

The blade 34 is fixed on the first end 331 of the blade 33 and extends away from the blade 33 for a predetermined length. The blade 35 is fixed on the second end 332 of the blade 33 and extends away from the blade 33 for the predetermined length. In a certain embodiment, the blade 34 and the blade 35 are located on the same side of the blade 33 and are parallel to one another. The blade 34 and the blade 35 may have the same length in the direction that is parallel to the longitudinal axis L1.

In some embodiments, the interface device 3 further includes a number of check members, such as first check member 36 and second check member 37. The first check member 36 and the second check member 37 are respectively positioned on a top surface 340 of the blade 34 and a top surface 350 of the blade 35. In a certain embodiment, the first check member 36 and the second check member 37 are arranged along the transverse axis T1 that is perpendicular to the longitudinal axis L1. Structural features of the first check member 36 and the second check member 37 are described below, in accordance with some embodiments.

Figure 4:
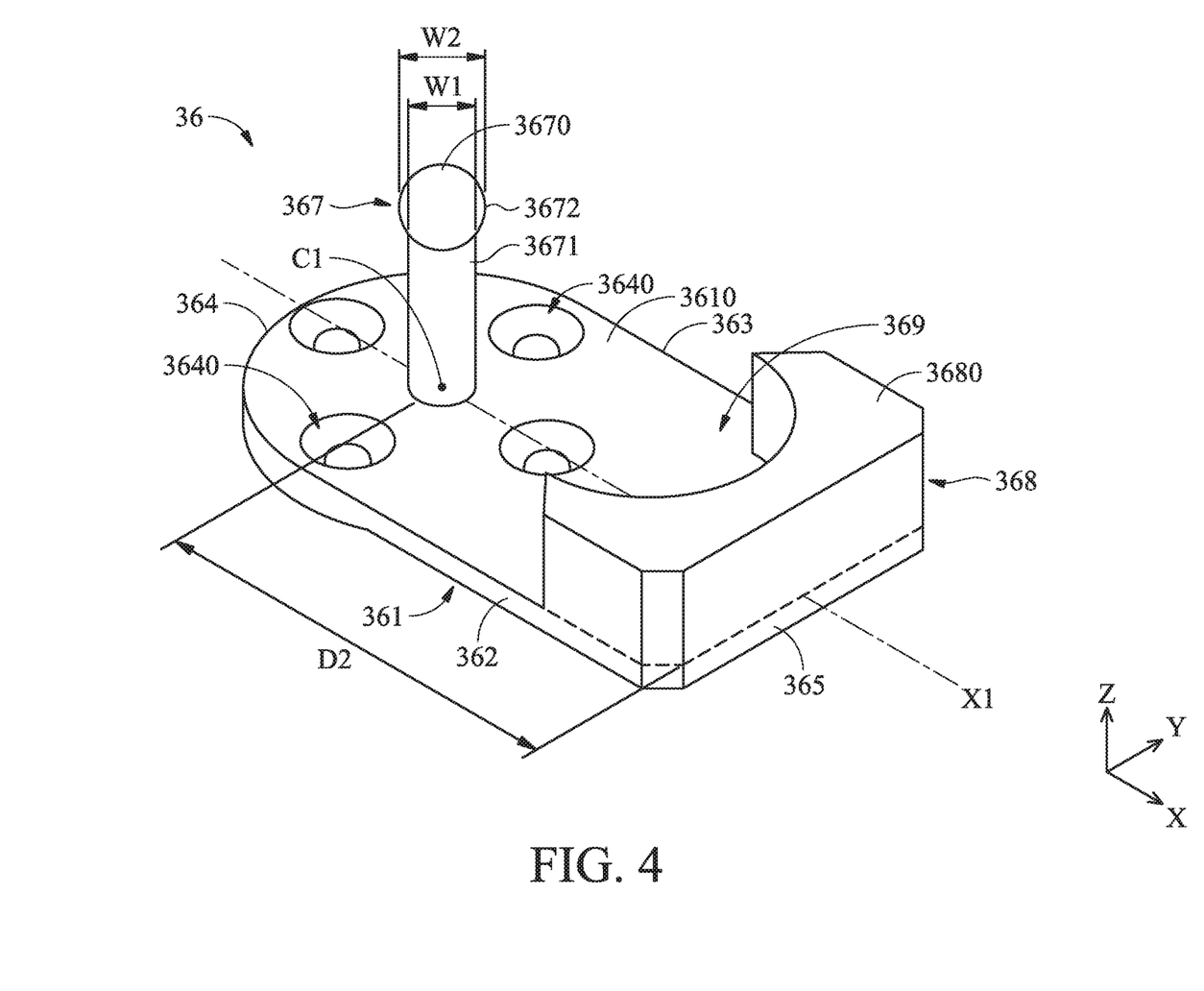
FIG. 4 shows a schematic view of a check member, in accordance with some embodiments.

Referring FIG. 4, in some embodiments, the first check member 36 includes a first base portion 361, a first positioning pin 367 and a first protrusion 368. The first base portion 361 has two straight edges 362 and 363 extending along a central axis X1 of the first check member 36. In addition, the first base portion 361 has a curved edge 364. The curved edge 364 is arranged in the central axis X1 and connects one end of the straight edge 362 to one end of the straight edge 363. The curved edge 364 may extend along a circular path with a center C1. The central axis X1 passes through the center C1. The radius of the curved edge 364 may be equal to half of the distance between the straight edge 362 and the straight edge 363.

It should be appreciated that many variations and modifications can be made to embodiments of the disclosure. In some embodiments, the radius of the curved edge 364 may be greater than half of the distance between the straight edge 362 and the straight edge 363. In other embodiments, the curved edge 364 is replaced by a straight edge that is connected to the straight edge 362 and the straight edge 363.

Moreover, the first base portion 361 has a straight edge 365. The straight edge 365 is arranged in the central axis X1 and located opposite to the curved edge 364. The straight edge 365 connects one end of the straight edge 362 to one end of the straight edge 363. The straight edge 365 may be perpendicularly connected to the straight edge 362 and the straight edge 363.

In one exemplary embodiment, the first positioning pin 367 is located at the center C1 of the curved edge 364. In some embodiments, the first positioning pin 367 protrudes from the top surface 3610 of the first base portion 361 and terminates at its distal end 3670.

As shown in FIG. 4, the first position pin 367 has a neck portion 3671 and a head portion 3672, in accordance with some embodiments. The neck portion 3671 is connected to the first base portion 361, and the head portion 3672 is connected to the top end of the neck portion 3671. In some embodiments, the head portion 3672 and the neck portion 3671 have different widths. For example, as shown in FIG. 4, the neck portion 3671 has a consistent width W1. In addition, the head portion 3672 has a spherical shape with a width W2. The width W2 may be greater than the width W1. However, it should be appreciated that many variations and modifications can be made to embodiments of the disclosure. In some other embodiments, the neck portion 3671 has a tapered shape in a cross-section that is perpendicular to the top surface 3610. The width of the neck portion 3671 is gradually decreased along a direction away from the first base portion 361.

The first protrusion 368 is immediately connected to the straight edge 365. The first protrusion 368 protrudes from the top surface 3610 of the first base portion 361 and terminates at its top surface 3680. In a certain embodiment, the top surface 3680 is a flat surface, and the top surface 3680 is parallel to the top surface 3610 of the first base portion 361.

The width of the first protrusion 368 in the direction that is perpendicular to the central axis X1 may be equal to the width of the base portion 361 in the same direction. In one exemplary embodiment, as shown in FIG. 4, there is a curved recess 369 formed on a side of the first protrusion 368 that directly faces the first positioning pin 367. The curved recess 369 reduces the volume of the first protrusion 368 while still supporting the probe card 100 with the first protrusion 368, which is described later in detail in connection with FIGS. 10 and 11.

In some embodiments, a number of through holes 3640 are formed on the first base portion 361. The through holes 3640 may be arranged surrounding the first positioning pin 367 (or the center C1). The first check member 36 may be affixed to the blade 34 via a number of fastening members (such as screws, not shown in figures) that pass through the through holes 3640.

Referring to FIG. 3, in some embodiments, the second check member 37 includes a second base portion 371, a second positioning pin 377, and a second protrusion 378. In a certain embodiment, the second base portion 371 and the second protrusion 378 are respectively configured the same way as the first base portion 361 and the first positioning pin 367. Therefore, the structural features of the second base portion 371 and the second protrusion 378 are not repeated for the purpose of brevity. In some embodiments, the second protrusion 378 is omitted.

In some embodiments, as shown in FIG. 3, the second positioning pin 377 has a neck portion 3771 and a head portion 3772. The neck portion 3771 is connected to the second base portion 371, and the head portion 3772 is connected to a top end of the neck portion 3771. The head portion 3772 and the neck portion 3771 may have different widths.

In some embodiments, the head portion 3772 has a spherical shape with a width W3. In some embodiments, the width W3 of the head portion 3772 of the second check member 37 may be greater than the width W2 of the head portion 3672 of the first check member 36. Differences between the width W2 and the width W3 may be in a range from about 0.1 mm to about 3 mm. However, it should be appreciated that many variations and modifications can be made to embodiments of the disclosure. The width W3 of the head portion 3772 of the second check member 37 may be equal to the width W2 of the head portion 3672 of the first check member 36.

Referring to FIG. 2, in some embodiments, when the first check member 36 is mounted on the blade 34, the first protrusion 368 is located farther away from the longitudinal axis L1 than the first positioning pin 367. In addition, when the second check member 37 is mounted on the blade 35, the second protrusion 378 is located farther away from the longitudinal axis L1 than the second positioning pin 377. Moreover, the first check member 36 and the second check member 37 are arranged along the transverse axis T1. As a result, the second protrusion 378, the second positioning pin 377, the first positioning pin 367, and the first protrusion 368 are arranged in order along the transverse axis T1.

Referring to FIG. 3, in some embodiments, the first check member 36 and the second check member 37 may be mounted on the blades 34 and 35 via mounting seats 345 and 355. The mounting seats 345 and 355 may have a number of threaded holes (not shown in figures) that are configured to match with the through holes, such as through holes 3640 shown in FIG. 4, of the first check member 36 and the second check member 37 to allow fastening members to pass through to affix the first check member 36 and the second check member 37 onto the blades 34 and 35. In some embodiments, the mounting seats 345 and 355 are omitted, and the first check member 36 and the second check member 37 are directly coupled to the top surfaces 340 and 350 of the blades 34 and 35.

In some embodiments, as shown in FIG. 3, when the check member 36 is positioned on the blade 34, the first positioning pin 367 has a height H1 relative to the top surface 340 of the blade 34, and the first protrusion 368 has a height H2 relative to the top surface 340 of the blade 34. In addition, the second positioning pin 377 has a height H3 relative to the top surface 350 of the blade 35, and the second protrusion 378 has a height H4 relative to the top surface 350 of the blade 35.

In some embodiments, the height H1 is substantially equal to the height H3, and the height H2 is substantially equal to the height H4. Moreover, the height H1 of the first positioning pin 367 is greater than the height H2 of the first protrusion 368, and the height H3 of the second positioning pin 368 is greater than the height H4 of the second protrusion 378, which allows insertion of the positioning pins 367 and 377 into through holes of the probe card 100 (which will be described later) without any interference occurring. The difference between the height H1 and the height H2 may be between about 8.5 mm and about 9 mm.

In some embodiments, as shown in FIG. 2, the interface device 3 further comprises a number of detection sensors, such as two detection sensors 38. The two detection sensors 38 are positioned on the top surface 340 of the blade 34 and the top surface 350 of the blade 35.

In a certain embodiment, the two detection sensors 38 are located farther away from the blade 33 than the first check member 36 and the second check member 37. In addition, the two detection sensors 38 are located farther away from the longitudinal axis L1 than the first check member 36 and the second check member 37. For example, the detection sensor 38 on the blade 34 is located farther away from the blade 33 than the first check member 36, and is located farther away from the longitudinal axis L1 than the first check member 36. Moreover, the detection sensor 38 on the blade 35 is located farther away from the blade 33 than the second check member 37, and is located farther away from the longitudinal axis L1 than the second check member 37.

In some embodiments, as shown in FIG. 3, each detection sensor 38 includes a housing 381 and a button 382. The housing 381 has a top surface 3810 that is parallel to the top surface 340 of the blade 34 or the top surface 350 of the blade 35. The top surface 3810 has a predetermined height H5 relative to the top surface 340 of the blade 34 or the top surface 350 of the blade 35. The button 382 is moveable relative to the top surface 3810 of the housing 381 from a released position to a compressed position as pressed by an object, such as a probe card 100.

Specifically, when the button 382 is in the released position, the top surface 3820 of the button 382 is distant from the top surface 3810 of the housing 381 by a traveling distance TD. As a result, a switch (not shown in figures) of the detection sensor 38 is not activated, and no signal is generated by the detection sensor 38. When the button 382 is in the compressed position, the button 382 is moved toward the inside of the housing 381 and the top surface 3820 of the button 382 is flush with the top surface 3810 of the housing 381. At this time, the switch (not shown in figures) of the detection sensor 38 is activated, and an electrical signal is generated by the detection sensor 38 and transmitted to the controller 6 (FIG. 1) for analysis.

It should be appreciated that the configuration of the detection sensor 38 should not be limited to the above-mentioned embodiments. In some embodiments, the button 382 is omitted, and the detection sensor 38 is a piezoelectric sensor. When an object such as probe card 100 is placed on the top surface 3810 of the housing 381, an electrical signal is generated by the detection sensor 38 and transmitted to the controller 6 (FIG. 1) for analysis. In other embodiments, the button 382 is omitted, and the detection sensor 38 includes a laser transducer and a laser detector positioned in the housing 38. The detection sensor 38 produces a laser and detects the reflected laser to measure the distance between an object and the detection sensor 38, and generates an electrical signal based on the measurement result, which is sent to the controller 6 (FIG. 1) for analysis.

Structural features of the probe card 100 are described below, in accordance with some embodiments.

Figure 5:
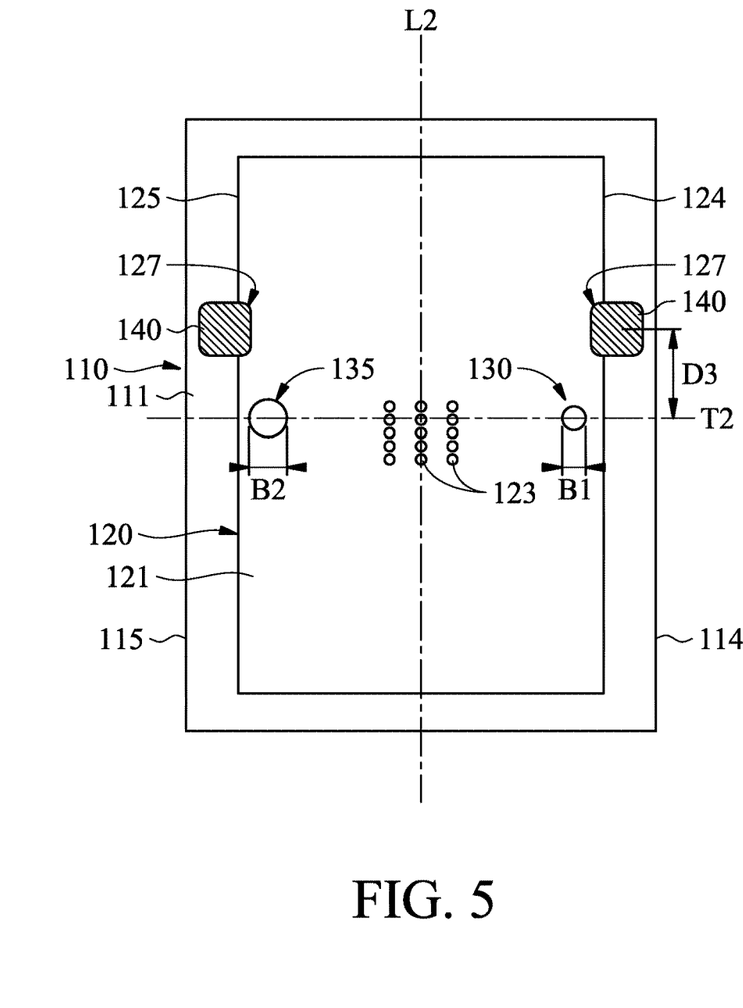
FIG. 5 shows a top view of a probe card, in accordance with some embodiments.
Figure 6:
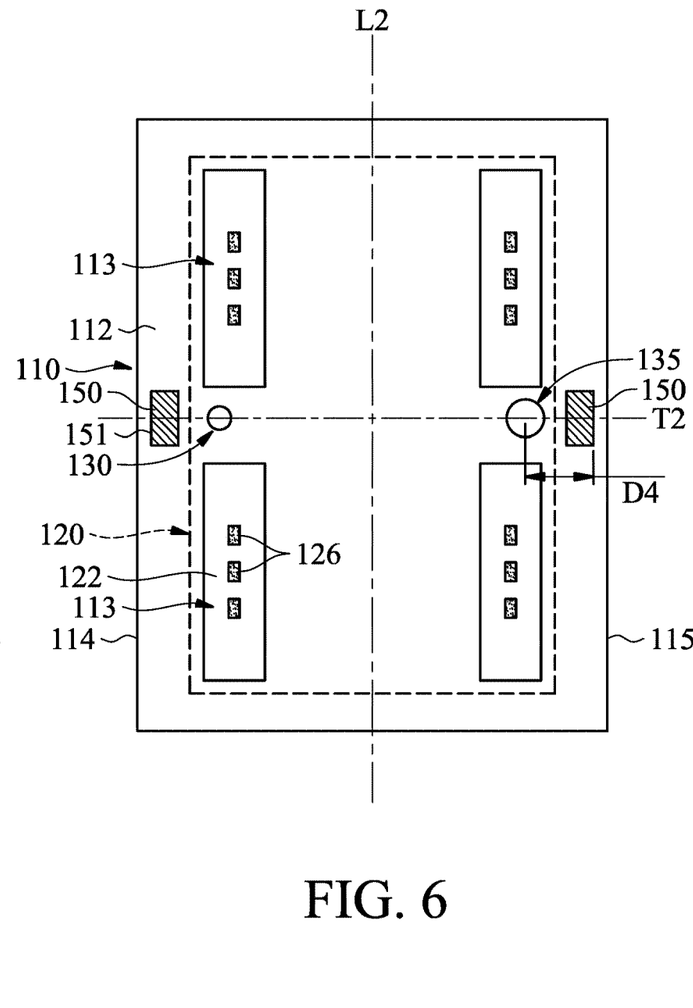
FIG. 6 shows a bottom view of a probe card, in accordance with some embodiments.

FIG. 5 shows a top view of the probe card 100 and FIG. 6 shows a bottom view of the probe card 100, in accordance with some embodiments. In some embodiments, the probe card 100 includes a support frame 110, a circuit board 120, two detection blocks 140, and two bottom pads 150. The support frame 110 has a rectangular shape with long sides that extend parallel to the longitudinal axis L2. The support frame 110 includes a front surface 111 and a rear surface 112, and a number of openings 113 penetrate from the front surface 111 to the rear surface 112.

The circuit board 120 has a rectangular shape with long sides that extend parallel to the longitudinal axis L2. The circuit board 120 is positioned on the front surface 111 of the support frame 110 and includes a front surface 121 and a rear surface 122. The rear surface 122 is in direct contact with the front surface 111 of the support frame 110. The circuit board 120 further includes a number of testing pins 123 and a number of contacts 126. The testing pins 123 are positioned on the front surface 121 of the circuit board 120, and the contacts 126 are positioned on the rear surface 122 of the circuit board 120. The contacts 126 are exposed by the opening 113. The testing pins 123 are electrically connected to the contacts 126.

In some embodiments, the probe card 100 includes a number of positioning holes, such as a first positioning hole 130 and a second positioning hole 135. The first positioning hole 130 and the second positioning hole 135 are located at two opposite sides of the longitudinal axis L2 and arranged along a transverse axis T2. The transverse axis T2 is perpendicular to the longitudinal axis L2. In some embodiments, the first positioning hole 130 and the second positioning hole 135 have different bore sizes. For example, as shown in FIG. 5, the first positioning hole 130 has a first bore size B1 and the second positioning hole 135 has a second bore size B2. The first bore size B1 is less than the second bore size B2. Differences between the first bore size B1 and the second bore size B2 may be in a range from about 0.1 mm to about 3 mm.

However, it should be appreciated that many variations and modifications can be made to embodiments of the disclosure. In some embodiments, the first bore size B1 is the same as the second bore size B2, particularly in cases where the width W2 of the first positioning pin 367 is the same as the width W3 of the second positioning pin 377. On the other hand, in cases where the width W2 of the first positioning pin 367 is different from the width W3 of the second positioning pin 377, the first positioning hole 130 and the second positioning hole 135 are configured to have different bore sizes.

In some embodiments, as shown in FIG. 5, two notches 127 are formed on two lateral edges 124 and 125 of the circuit board 120. The two lateral edges 124 and 125 of the circuit board 120 are located at two opposite sides of the longitudinal axis L2 and extend parallel to the longitudinal axis L2. The two notches 127 are located away from the transverse axis T2.

The two detection blocks 140 are positioned on the front surface 111 of the support frame 110 and positioned in the two notches 127 of the circuit board 120. The two detection blocks 140 are arranged so that when the probe card 100 is placed in a normal state, the detection blocks 140 press the two detection sensors 38. For example, as shown in FIG. 5, the center of the detection block 140 may be a distance D3 away from the transverse axis T2. The distance D3 is equal to the distance D1 (FIG. 2) between the button 382 and the transverse axis T1. The distance D3 may be in a range from about 100 mm to about 102 mm.

Figure 8:
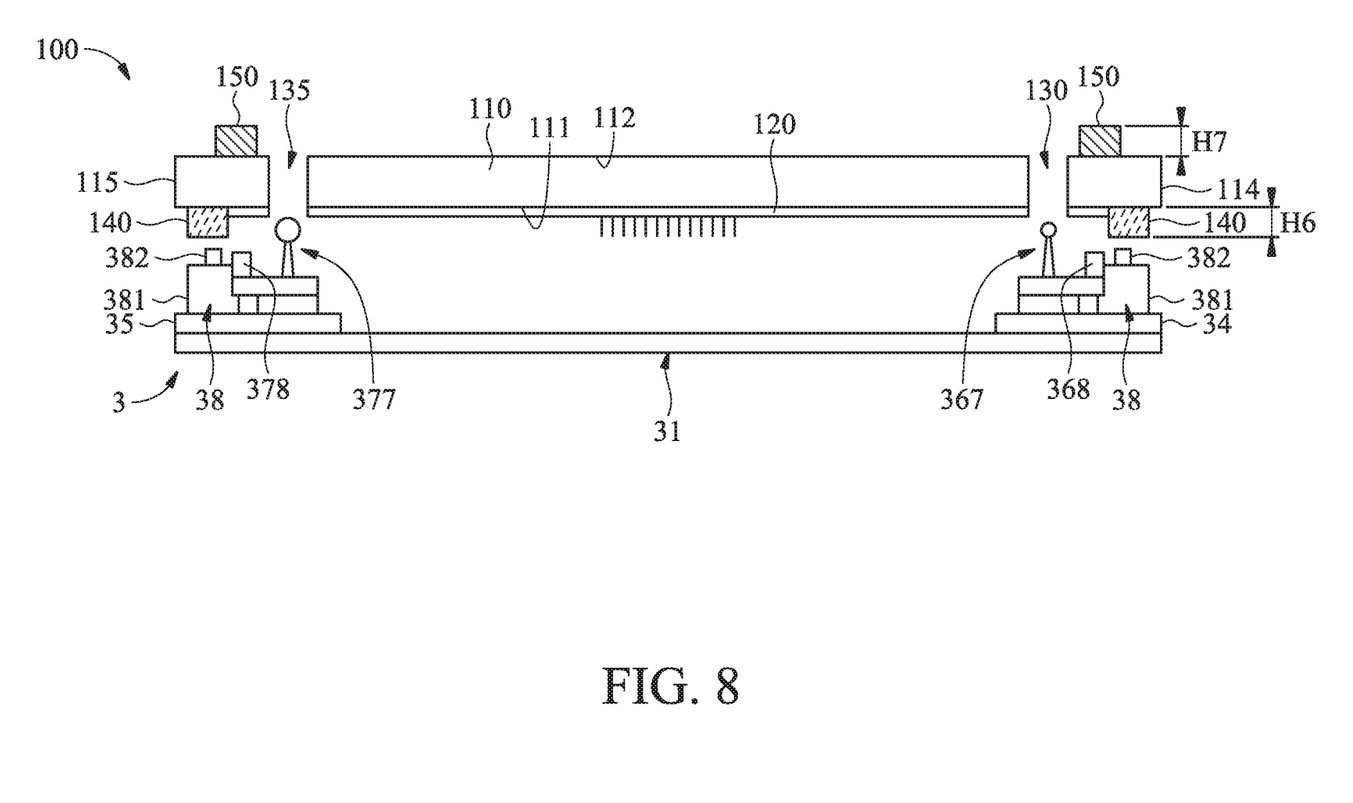
FIG. 8 shows a cross-sectional view of partial elements of a test system before a probe card is placed on an interface device, in accordance with some embodiments.

In addition, as shown in FIG. 8, the two detection blocks 140 may have a cylindrical shape and a height H6 relative to the front surface 111 of the support frame 110, as shown in FIG. 8. In a certain embodiment, the height H6 is greater than the difference between the predetermined height H5 (FIG. 3) of the housing 381 and the height H2 (FIG. 3) of the protrusion 368, such that the button 382 can be completely pressed by the detection block 140 when the probe card 100 is placed in a normal state with no interference occurring between the probe card 100 and the protrusions 368 and 378. The height H6 may be in a range from about 4.8 mm to about 5.2 mm.

In some embodiments, as shown in FIG. 6, the two bottom pads 150 are positioned on the rear surface 112 of the support frame 110. In addition, the two bottom pads 150 are located at two opposite sides of the longitudinal axis L2 and arranged along the transverse axis T2. The bottom pad 150 is located farther away from the longitudinal axis L2 than one of the first positioning hole 130 and the second positioning hole 135 which is located on the same side of the longitudinal axis L2. As a result, one of the bottom pads 150, the second positioning hole 135, the first positioning hole 130, and the other bottom pad 150 are arranged in order along the transverse axis T2. The two bottom pads 150 are arranged as such the protrusions 368 and 378 (FIG. 3) can be abutted against the bottom pads 150 when the probe card 100 is placed upside down. For example, there is a distance D4 between the center of the second positioning hole 135 and the outer edge 151, which is away from the longitudinal axis L2, that is equal to the distance D2 (FIG. 4).

Figure 7:
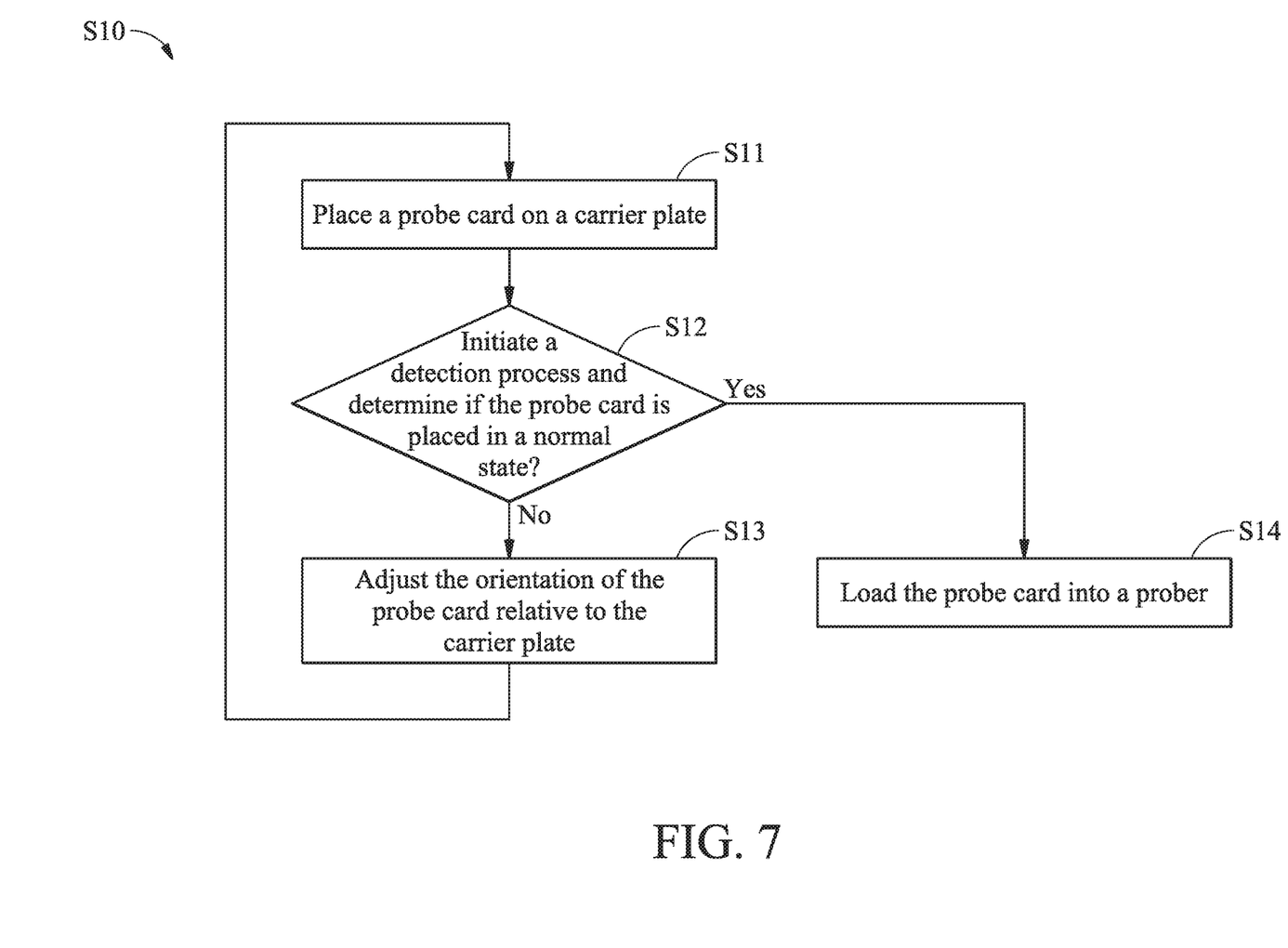
FIG. 7 shows a flow chart of a false detection method in loading a probe card into a test system, in accordance with some embodiments.

FIG. 7 is a simplified flowchart of a method S10 of enabling fault detection within the test system 1, in accordance with some embodiments. For illustration, the flow chart will be described along with the drawings shown in FIGS. 9-12. Some of the described stages can be replaced or eliminated in different embodiments.

The method S10 includes operation S11, in which a probe card, such as probe card 100, is placed on the carrier plate 31. In some embodiments, the probe card 100 is placed on the carrier plate 31 manually. Therefore, there is a possibility that the probe card 100 may be placed on the carrier plate 31 in an abnormal state. Abnormal states include conditions in which the probe card 100 is placed backwards or upside down due to human error. If the probe card 100 is sent into the prober 2 in an abnormal state, the probe card 100 will be damaged.

In order to avoid the abnormal state, the method S10 continues in operation S12, in which a detection process is performed to determine if the probe card 100 is placed on the carrier plate 31 in a normal state or in an abnormal state. Various configurations of the probe card 100 placed on the carrier plate 31 are described below, in accordance with some embodiments.

Figure 9:
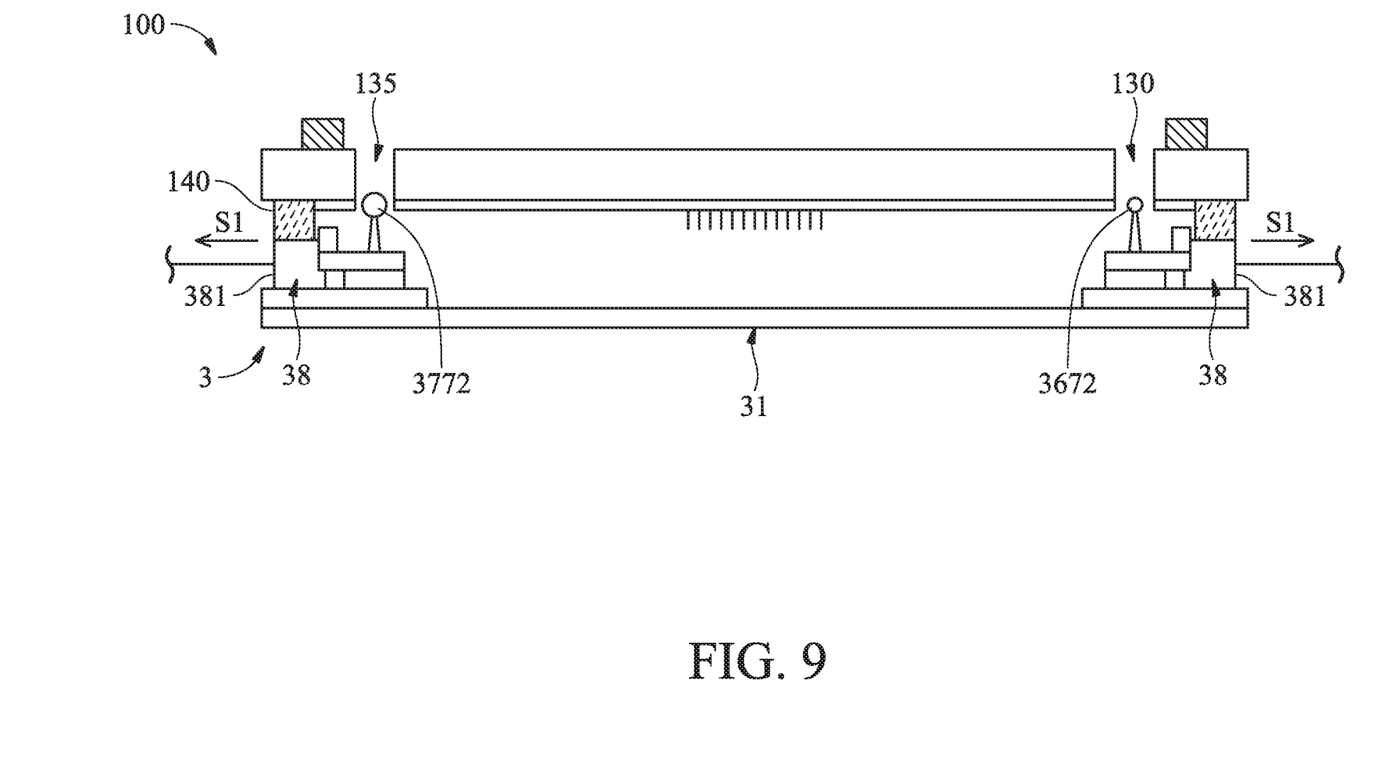
FIG. 9 shows a cross-sectional view of partial elements of a test system after a probe card is placed on an interface device in a normal state, in accordance with some embodiments.

FIG. 8 shows a cross-sectional view of the probe card 100 before being placed on the carrier plate 31 in the normal state, in accordance with some embodiments. FIG. 9 shows a cross-sectional view of the probe card 100 on the carrier plate 31 in the normal state, in accordance with some embodiments. In some embodiments, the correct process for placing the probe card 100 on the carrier plate 31 in the normal state include facing the front surface 111 of the support frame 110 downward with the circuit board 120 positioned between the support frame 110 and the carrier plate 31.

The correct process also includes placing the probe card 100 properly such that the lateral edge 114 and the lateral edge 115 respectively correspond to the blade 34 and blade 35. The correct process further includes aligning the positioning holes 130 and 135 of the probe card 100 with the respective positioning pins 367 and 377, and aligning the two detection blocks 140 with the detection sensors 38, as shown in FIG. 8. That is, the transverse axis T1 of the carrier plate 3 (FIG. 2) aligns with the transverse axis T2 of the probe card 100.

In addition, the correct process includes lowering the probe card 100 until the two detection blocks 140 abut the housings 381 of the two detection sensors 38, and until a portion of the head portion 3672 is inserted into the through holes 130, and a portion of the head portion 3772 is inserted into the through hole 135, as shown in FIG. 9.

At the same time, the buttons 382 are fully compressed (i.e., the detection block abuts the corresponding housing) by the detection blocks 140, the two detection sensors 38 produce electrical signals S1 and transmit the electrical signals S1 to the controller 6 (FIG. 1). The controller 6 performs an analysis of the electrical signals S1 from the two detection sensors 38, and indicates that the probe card 100 is placed on the carrier plate 31 in a normal condition.

In response to the analysis result from the controller 6, the method continues in operation S14, in which the probe card 100 is loaded into the prober 2, as indicated by the dotted lines shown in FIG. 1. In some embodiments, the carrier plate 31 moves the probe card 100 to a position below the card holder 22. Afterwards, the probe card 100 is secured by the card holder 22 and directly interfaces with the test head 4. Afterwards, the carrier plate 31 is removed. In some embodiments, after the probe card 100 is loaded into the prober 2, the semiconductor wafer W is loaded on the wafer-mounted table 23 such that the testing pins 123 of the probe card 100 face the semiconductor wafer W. Afterwards, the semiconductor wafer W is moved to approach the testing pins 121 of the probe card 100 to perform a wafer acceptance test.

To perform the wafer acceptance test, one or more testing pins 123 may furnish a predefined signal (e.g., a stimulus signal) to one or more dies (not shown in figures) to test the functionality of the integrated circuits associated with the dies. The predefined signals may be generated by a testing program loaded into the test head 4). Similarly, one or more of the testing pins 123 receive signals generated by the integrated circuit(s) in response to the predefined signals, which are compared to validation signals furnished by the testing program. When a specific die passes all the tests, its position is remembered for later use during IC packaging. Non-passing dies are remembered. For example, a non-passing die may be marked with a small ink dot in the middle of the die, or information describing the positions of passing and non-passing dies within the semiconductor wafer W may be stored in a file (e.g., a wafer map).

Figure 10:
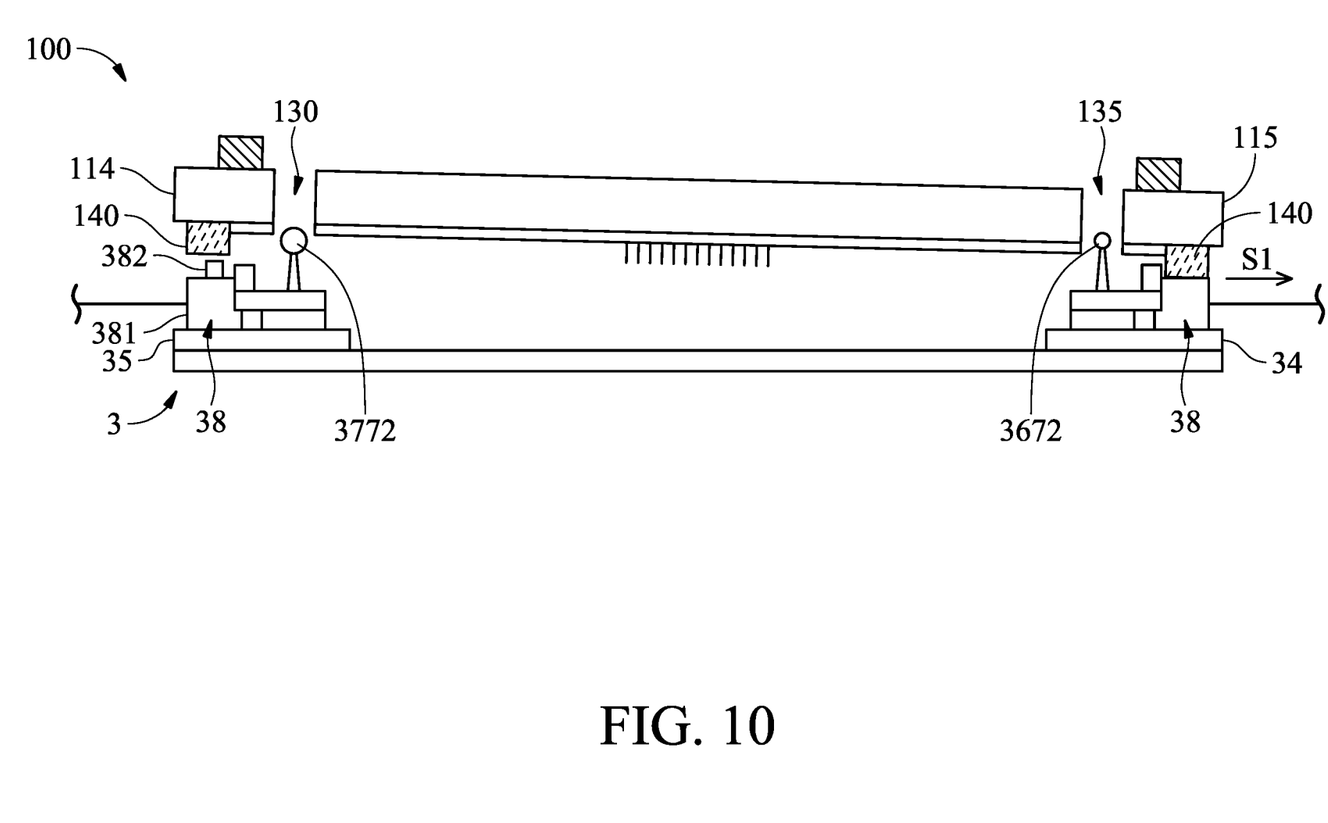
FIG. 10 shows a cross-sectional view of partial elements of a test system after a probe card is placed on an interface device in an abnormal state where the probe card is placed backwards, in accordance with some embodiments.

FIG. 10 shows a cross-sectional view of partial elements of the probe card 100 being placed on the carrier plate 31 in an abnormal state where the probe card was placed backwards, in accordance with some embodiments. In some embodiments, as shown in FIG. 10, the probe card 100 was placed backwards on the carrier plate 31 (i.e. lateral edge 115 is located above blade 34, and lateral edge 114 is located above blade 35) due to human error or another reason.

With an abnormal state such as that shown in FIG. 10, while a portion of the head portion 3672 may be inserted into the through hole 135, the head portion 3772 is blocked by the opening of the through hole 130 and cannot be inserted into the through hole 130. This results in a slanted arrangement of the probe card 100 relative to the carrier plate 31. In addition, in the slanted arrangement, the detection sensor 38 located on the blade 34 may be pressed by the probe card 100 and produce an electrical signal S1, the detection sensor 38 located on the blade 35 is distant from the detection block 140 and not pressed by the detection block 140, and no electrical signal is produced by the detection sensor 38.

In some embodiments, when the controller 6 detects the lack of an electrical signal S1 from either of the detection sensors 38, the controller 6 issues a warning, and the method S10 continues to operation S13 to call maintenance personnel to adjust the orientation of the probe card 100 relative to the carrier plate 31. Adjustment of the probe card 100 may include removing the probe card 100 from the carrier plate 31 and placing the probe card 100 on the carrier plate 31 again after rotation of the probe card 100. After adjustment of the probe card 100, the method S10 repeats operations S11 and S12. If the probe card 100 is in its proper placement, the method S10 continues in operation S14, sending the probe card 100 into the prober 2 for conducting a wafer acceptance test, for example.

In some embodiments, based on the received electrical signal, the controller 6 determines the error type and shows instructions to maintenance personnel about how to adjust the probe card so as to place it in a normal state. For example, based on a correct signal (i.e., the presence of an electrical signal S1) produced by one of the detection sensors 38 and a false signal (i.e., the lack of an electrical signal S1) produced by the other detection sensor 38, the controller 6 provides instructions for flipping the probe card 100 left to right. As a result, maintenance personnel may adjust the probe card 100 efficiently and correctly and place the probe card 100 on the carrier plate 31 again according to the instructions generated by the controller 6.

Figure 11:
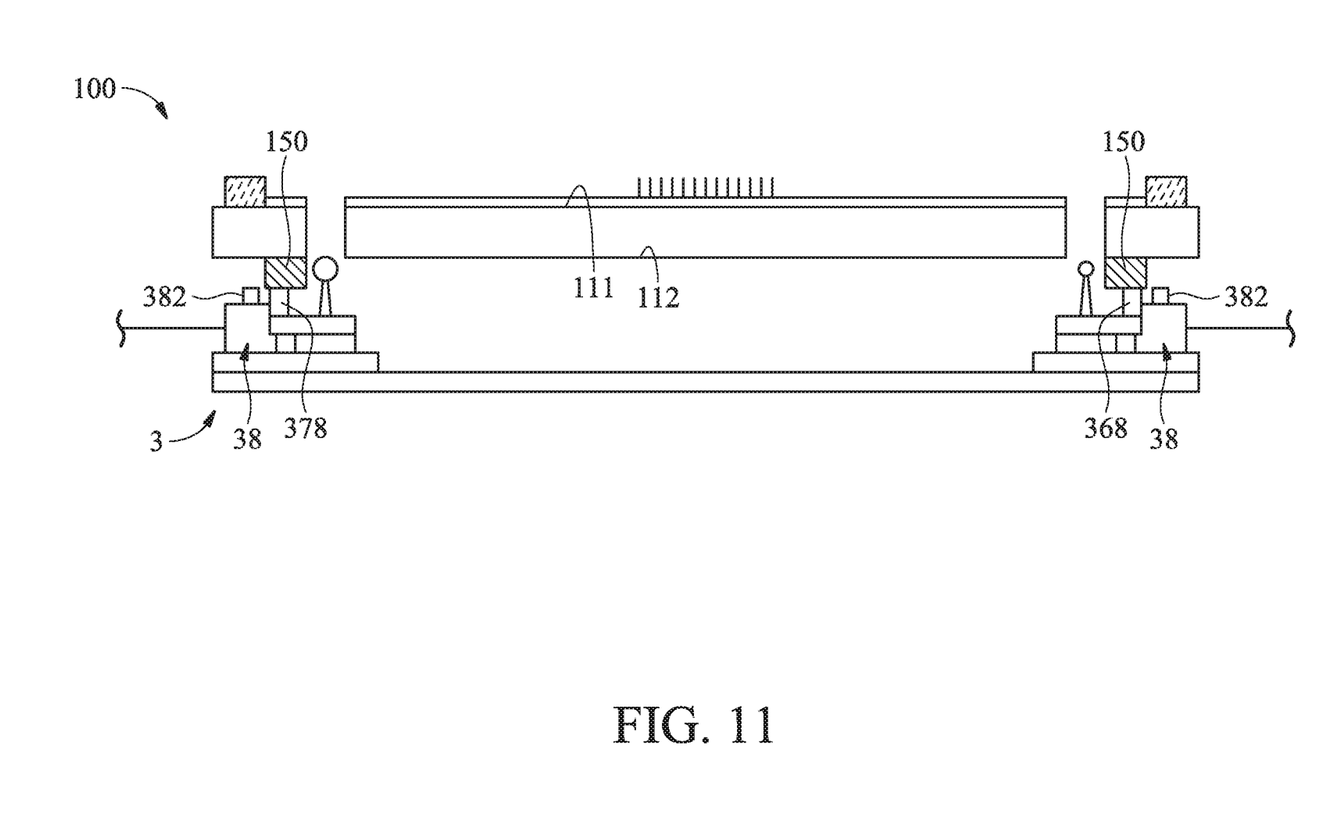
FIG. 11 shows a cross-sectional view of partial elements of a test system after a probe card is placed on an interface device in an abnormal state where the probe card is placed upside-down, in accordance with some embodiments.

FIG. 11 shows a cross-sectional view of partial elements of the probe card 100 being placed on the carrier plate 31 in an abnormal state where the probe card 100 is placed upside-down, in accordance with some embodiments. In some embodiments, as shown in FIG. 11, the probe card 100 is placed on the carrier plate 31 upside-down (i.e. the rear surface 112 faces the interface device 3 and the front surface 111 faces upwards) due to human error or other reasons.

In an abnormal state such as the one shown in FIG. 11, the protrusions 368 of the first check member 36 abut the corresponding bottom pad 150, and the protrusions 378 of the second check member 37 abut the corresponding bottom pad 150, which make the rear surface 112 of the probe card 100 stay away from the buttons 382 of the detection sensors 38. As a result, no detection sensor 38 is pressed by the probe card 100, and no electrical signal is produced by the detection sensor 38.

In some embodiments, the controller 6 detects the lack of an electrical signal S1 from both detection sensors 38, the controller 6 issues a warning, and the method S10 continues to operation S13 to call personnel to adjust the orientation of the probe card 100 relative to the carrier plate 31. After adjustment of the probe card 100, the method S10 repeats operations S11 and S12. If the probe card 100 is in its proper placement, the method S10 continues to operation S14, sending the probe card 100 into the prober 2 for conducting a wafer acceptance test, for example.

In some embodiments, based on the received electrical signal, the controller 6 determines the error type and shows instructions to maintenance personnel about how to adjust the probe card so as to place it in a normal state. For example, in response to false signals (i.e., the lack of an electrical signal S1) produced by both detection sensors 38, the controller 6 provides instructions for turning the probe card 100 upside down. As a result, maintenance personnel may adjust the probe card 100 efficiently and correctly and place the probe card 100 on the carrier plate 31 again according to the instructions generated by the controller 6.

Figure 12:
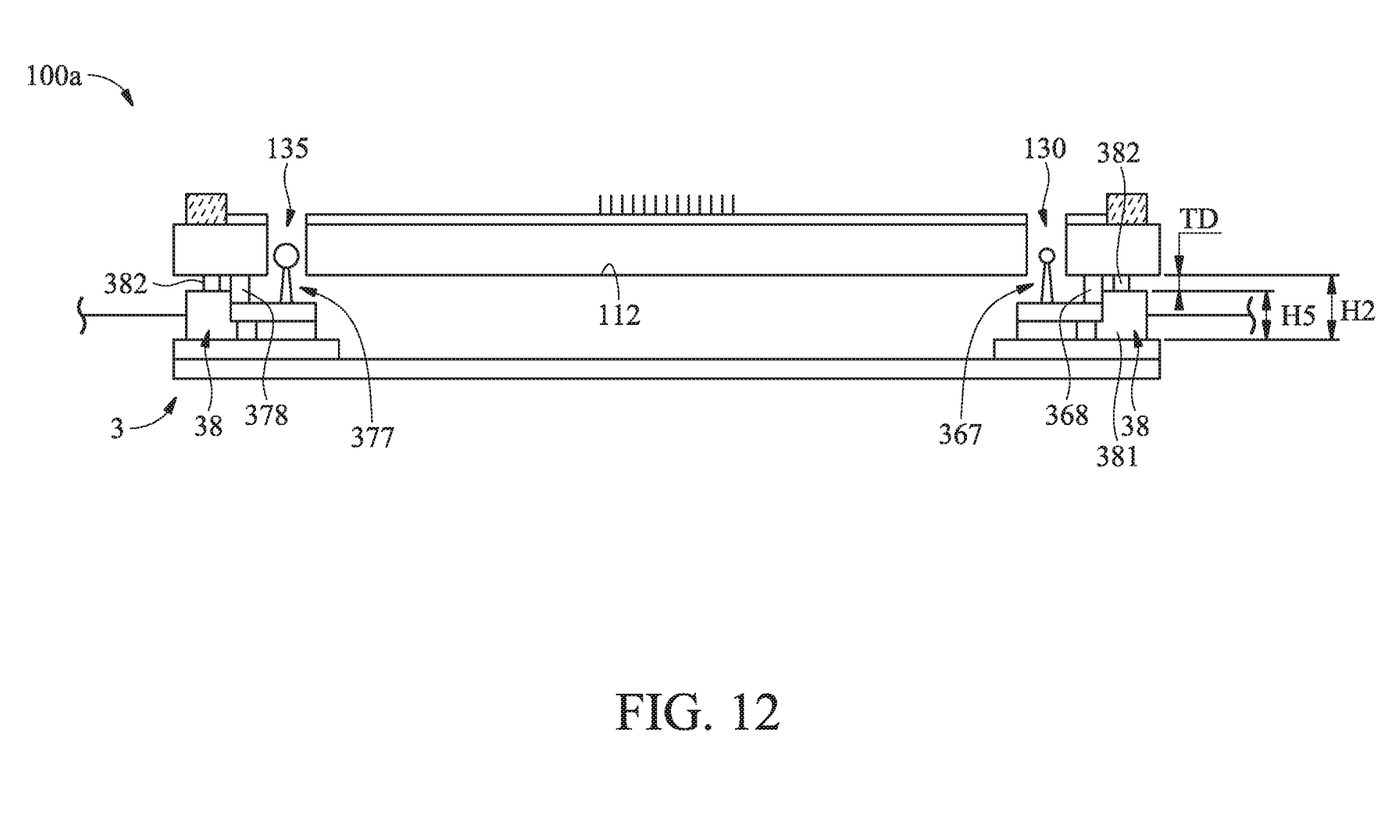
FIG. 12 shows a cross-sectional view of partial elements of a test system after a probe card is placed on an interface device in an abnormal state where the probe card is placed upside-down, in accordance with some embodiments.

It should be understood that the configuration of the probe card 100 is not limited herein and may be adjusted. FIG. 12 shows a cross-sectional view of a probe card 100a being placed on the interface device 3. Differences between the probe card 100a and the probe card 100 shown in FIG. 11 include the omission of the bottom pads 150.

In some embodiments, the traveling distance TD of the button 382 is shorter than or equal to a difference between the predetermined height H5 of the housing 381 and the height H2 of the protrusion 368. As a result, when the probe card 100a is placed upside down on the carrier plate 31, the rear surface 112 of the probe card 100 directly abuts the protrusions 368 and 378 without pressing the button 382. Therefore, no detection sensor 38 is pressed by the probe card 100a, and no electrical signal is produced by the detection sensor 38. Accordingly, operation S13 is conducted to adjust the probed card 100.

In some embodiments, the traveling distance TD of the button 382 is greater than the difference between the predetermined height H5 of the housing 381 and the height H2 of the protrusion 368, and the height H2 of the protrusion 368 is greater than the predetermined height H5 of the housing 381. While the buttons 382 may be pressed by the rear surface 112 of the probe card 100 when the probe card 100a is placed upside down on the carrier plate 31, no electrical signal is produced by the detection sensor 38 because the buttons 382 are not completely pressed. Accordingly, operation S13 is conducted to adjust the probed card 100.

Embodiments of method for loading a probe card into a prober utilize an interface device to transport the probe card. The interface device includes check members which are configured to determine the orientation of the probe card. When the probe card is placed in an abnormal state, interference that occurs between the check member and the probe card block the probe card from touching detection sensors located on the interface device. As a result, detection signals generated by the detection sensors deviate from the preset criteria, and an abnormal state is detected. Therefore, improper placement of the probe card is solved, and damage to the probe card due to collision during transportation can be avoided.

In accordance with some embodiments, a method for loading a probe card into a prober is provided. The method includes placing a probe card on a carrier plate of the prober. The method further includes analyzing signals produced by two detection sensors after the probe card has been placed on the carrier plate. The detection sensor produces the correct signal in response to the probe card being located over the corresponding detection sensor in a normal state, and the detection sensor produces a false signal in response to the probe card being located over the corresponding detection sensor in an abnormal state. The method also includes sending the probe card into a prober in response to the correct signals produced by both the detection sensors. Alternatively, the method also includes removing the probe card from the carrier plate and placing the probe card on the carrier plate again after adjustment of the probe card in response to a false signal produced by either of the detection sensors.

In accordance with some embodiments, an interface device adapted for supporting an object used for testing semiconductor wafers. The interface device includes a carrier plate having a longitudinal axis. The interface device further includes two detection sensors positioned on the carrier plate and located on two sides of the longitudinal axis. Each detection sensor includes a housing having a predetermined height relative to the carrier plate. The interface device also includes a first check member and a second check member positioned on the carrier plate and located on two sides of the longitudinal axis. The first check member includes a first positioning pin connected to the carrier plate, and the first positioning pin has a first width. The first check member further includes a first protrusion connected to the carrier plate and having a first height relative to the carrier plate, wherein the first height is greater than the predetermined height. The second check member includes a second positioning pin connected to the carrier plate, and the second positioning pin has a second width which is different than the first width.

In accordance with some embodiments, a test system is provided. The test system includes the interface device mentioned above. The test system further includes a probe card positioned on the interface device. The probe card includes a support frame with a front surface that abuts the two detection sensors. The probe card further includes a number of signal pins located above the front surface of the support frame. The probe card also includes a first positioning hole and a second positioning hole aligned with the first positioning pin and the second positioning pin, respectively.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An interface device adapted for supporting an object used for testing semiconductor wafer, comprising:
   a carrier plate having a longitudinal axis;
   two detection sensors positioned on the carrier plate and located on two sides of the longitudinal axis, wherein each detection sensor comprises a housing having a predetermined height relative to the carrier plate; and
   a first check member and a second check member positioned on the carrier plate and located on two sides of the longitudinal axis;
   wherein the first check member comprises a first positioning pin connected to the carrier plate and having a first width, and a first protrusion connected to the carrier plate and having a first height relative to the carrier plate, wherein the first height is greater than the predetermined height;
   wherein the second check member comprises a second positioning pin connected to the carrier plate and having a second width which is different than the first width.

2. The interface device as claimed in claim 1, wherein each of the two detection sensors comprises a button that is movable relative to the corresponding housing from a released position to a compressed position while being pressed by the object.

3. The interface device as claimed in claim 2, wherein a top surface of the button is distant from the housing by a traveling distance when the button is in the released position, wherein the traveling distance is smaller than or equal to a difference between the predetermined height and the first height.

4. The interface device as claimed in claim 1, wherein the first positioning pin, the first protrusion and the second positioning pin are arranged along a transverse axis that is perpendicular to the longitudinal axis.

5. The interface device as claimed in claim 1, wherein the second check member further comprises a second protrusion positioned on the first base carrier plate and having a second height relative to the carrier plate, wherein the second height is greater than the predetermined height.

6. The interface device as claimed in claim 1, wherein the first positioning pin and the second positioning pin each comprises a head portion located at their distal end, wherein the head portion of the first positioning pin has the first width and the head portion of the second positioning pin has the second width which is different than the first width.

7. The interface device as claimed in claim 6, wherein the head portion of the first positioning pin and the head portion of the second positioning pin each have a spherical shape.

8. The interface device as claimed in claim 1, wherein the carrier plate comprises two blades located on two sides of the longitudinal axis, and each of the blades has one of the detection sensors and one of the first and second check members positioned thereon.

9. The interface device as claimed in claim 1, wherein each of the detection sensors is located farther away from the longitudinal axis than one of the first position pin and the second positioning pin which is located on the same side of the longitudinal axis.

10. A test system, comprising:
    an interface device comprising:
    a carrier plate having a longitudinal axis;
    two detection sensors positioned on the carrier plate and located on two sides of the longitudinal axis, wherein each detection sensor comprises a housing having a predetermined height relative to the carrier plate; and a first check member and a second check member positioned on the carrier plate and located on two sides of the longitudinal axis;

wherein the first check member comprises a first positioning pin connected to the carrier plate and having a first width, and a first protrusion connected to the carrier plate and having a first height relative to the carrier plate, wherein the first height is greater than the predetermined height;

wherein the second check member comprises a second positioning pin connected to the carrier plate and having a second width which is different than the first width; and a probe card positioned on the interface device and comprising:

a support frame with a front surface that abuts the two detection sensors;

a plurality of signal pins located above the front surface of the support frame; and a first positioning hole and a second positioning hole aligned with the first positioning pin and the second positioning pin, respectively.

11. The test system as claimed in claim 10, wherein the first positioning hole and the second positioning hole are arranged along a transverse axis that passes through a center of the support frame.

12. The test system as claimed in claim 10, further comprising two bottom pads extruding from a rear surface of the support frame and located adjacent to the first positioning hole and the second positioning hole;

wherein the two bottom pads, the first positioning hole and the second positioning hole are arranged along a transverse axis that is perpendicular to the longitudinal axis.

13. The test system as claimed in claim 12, wherein each of the first positioning hole and the second positioning hole is located closer to the longitudinal axis than the neighboring bottom pad.

14. A test system, comprising:

an interface device comprising:

a carrier plate having a longitudinal axis;

two detection sensors positioned on the carrier plate and located on two sides of the longitudinal axis, wherein each detection sensor comprises a housing having a predetermined height relative to the carrier plate; and a first check member and a second check member positioned on the carrier plate and located on two sides of the longitudinal axis;

wherein the first check member comprises a first positioning pin connected to the carrier plate, and a first protrusion connected to the carrier plate and having a first height relative to the carrier plate, wherein the first height is greater than the predetermined height;

wherein the second check member comprises a second positioning pin connected to the carrier plate, and a second protrusion connected to the carrier plate and having a second height relative to the carrier plate, wherein the second height is greater than the predetermined height; and a probe card positioned on the interface device and comprising:

a support frame with a front surface that abuts the two detection sensors;

a plurality of signal pins located above the front surface of the support frame; and a first positioning hole and a second positioning hole aligned with the first positioning pin and the second positioning pin, respectively.

15. The test system as claimed in claim 14, wherein the first positioning pin, the first protrusion, the second positioning pin and the second protrusion are arranged along a transverse axis that is perpendicular to the longitudinal axis.

16. The test system as claimed in claim 15, wherein the first protrusion is located farther away from the longitudinal axis than the first positioning pin, and the second protrusion is located farther away from the longitudinal axis than the second positioning pin.

17. The test system as claimed in claim 14, wherein each of the two detection sensors further comprises a button that is movable relative to the corresponding housing from a released position to a compressed position while being pressed by the support frame of the probe card.

18. The test system as claimed in claim 14, widths of the first positioning pin and the second positioning pin correspond to bore sizes of the first positioning hole and the second positioning hole, respectively;

wherein the width of the first positioning pin is greater than the width of the second positioning pin, and the bore size of the first positioning hole is greater than the bore size of the second positioning hole.

19. The test system as claimed in claim 14, wherein widths of the first positioning pin and the second positioning pin correspond to bore sizes of the first positioning hole and the second positioning hole, respectively;

wherein the width of the first positioning pin is the same as the width of the second positioning pin, and the bore size of the first positioning hole is the same as the bore size of the second positioning hole.

20. The test system as claimed in claim 14, further comprising two bottom pads extruding from a rear surface of the support frame and located adjacent to the first positioning hole and the second positioning hole;

wherein the two bottom pads, the first positioning hole and the second positioning hole are arranged along a transverse axis that is perpendicular to the longitudinal axis.

* * * * *